United States Patent
Tandoi

(10) Patent No.: US 11,303,098 B1
(45) Date of Patent: Apr. 12, 2022

(54) MULTI-JUNCTION VCSEL WITH COMPACT ACTIVE REGION STACK

(71) Applicant: II-VI Delaware, Inc., Wilmington, DE (US)

(72) Inventor: Giuseppe Tandoi, Zurich (CH)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 16/951,020

(22) Filed: Nov. 18, 2020

(51) Int. Cl.
*H01S 5/00* (2006.01)
*H01S 5/30* (2006.01)
*H01S 5/183* (2006.01)
*H01S 5/34* (2006.01)

(52) U.S. Cl.
CPC ........ *H01S 5/3095* (2013.01); *H01S 5/18311* (2013.01); *H01S 5/18397* (2013.01); *H01S 5/3416* (2013.01)

(58) Field of Classification Search
CPC ............. H01S 5/18397; H01S 5/18311; H01S 5/3416; H01S 5/3095
See application file for complete search history.

(56) References Cited

U.S. PATENT DOCUMENTS

| 6,060,723 | A | * | 5/2000 | Nakazato | H01L 29/66825 257/E21.654 |
| 7,501,294 | B1 | * | 3/2009 | Nakagawa | B82Y 20/00 438/22 |
| 7,953,135 | B2 | | 5/2011 | Onishi | |
| 10,008,826 | B1 | | 6/2018 | Padullaparthi | |
| 10,707,650 | B2 | * | 7/2020 | Ghosh | H01S 5/18386 |
| 2005/0002430 | A1 | * | 1/2005 | Ryou | H01S 5/042 372/44.01 |
| 2007/0145388 | A1 | * | 6/2007 | Philippens | H01S 5/18383 257/86 |
| 2007/0153867 | A1 | * | 7/2007 | Muller | H01S 5/18355 372/50.124 |
| 2008/0197289 | A1 | * | 8/2008 | Muller | G01S 7/4818 250/370.01 |
| 2013/0264544 | A1 | * | 10/2013 | Karg | H01L 29/775 257/24 |

(Continued)

OTHER PUBLICATIONS

Korshak, A.N. et al., "Tunnel-Junction-Connected Distributed-Feedback Vertical-Cavity Surface-Emitting Laser", Applied Physics Letters, vol. 73, No. 11, Sep. 14, 1998, pp. 1475-1477.

*Primary Examiner* — Kinam Park
(74) *Attorney, Agent, or Firm* — Wendy W. Koba

(57) ABSTRACT

A multi-junction VCSEL is formed by as a compact structure that reduces lateral current spreading by reducing the spacing between adjacent active regions in the stack of such regions used to from the multi-junction device. At least two of the active regions within the stack are located adjacent peaks of the intensity profile of the VCSEL, with an intervening tunnel junction positioned at a trough between the two peaks. The alignment of the active regions with the peaks maximizes the generated optical power, while the alignment of the tunnel junction with the trough minimizes optical loss. The close spacing on adjacent peaks forms a compact structure (which may even include a cavity having a sub-$\lambda$ optical length) that lessens the total path traveled by carriers and therefore reduces lateral current spread.

10 Claims, 8 Drawing Sheets

(56) References Cited

U.S. PATENT DOCUMENTS

2020/0106242 A1     4/2020   Kalifa et al.
2020/0335942 A1   10/2020   Carson et al.
2021/0336420 A1* 10/2021   Tandoi .................... H01S 5/343

* cited by examiner

MULTI-JUNCTION VCSEL WITH COMPACT ACTIVE REGION STACK

TECHNICAL FIELD

The present invention relates to a vertical cavity surface emitting laser (VCSEL) device and, more particularly, to a VCSEL having two or more active regions formed in a stack and separated by a tunnel junction, the stack itself compacted in terms of the number of individual layers so as to confine lateral current spread, increasing optical confinement and minimizing optical loss.

BACKGROUND OF THE INVENTION

A VCSEL has a laser cavity that is sandwiched between and defined by two mirror stacks. A VCSEL is typically fabricated on a semiconductor substrate (in many cases a GaAs or InP substrate), with a "bottom" mirror stack formed on the top surface of the substrate, and then covered by the laser cavity and "top" mirror stack. Each mirror stack includes a number of epitaxial layers of alternating refractive index values (i.e., alternating between "high" and "low" refractive index values. The cavity region itself includes the active region, which may be formed, for example, by one or more quantum well structures. As light passes from a layer of one index of refraction to another, a portion of the light is reflected, creating a diffractive Bragg reflector (DBR) structure. By using a sufficient number of alternating layers, a high percentage of light is reflected and creates a standing wave pattern across the cavity.

At a sufficiently high bias current (referred to as the threshold current), the injected minority carriers form a population inversion in the quantum wells, producing gain. When the optical gain exceeds the total loss in the two mirrors, laser emission occurs through an outer surface of one of mirror stacks. When compared to conventional edge-emitting laser diodes, a VCSEL offers lower threshold currents, low-divergence circular output beams, and longitudinal single mode emission (as well as other benefits in particular applications).

In some configurations, an additional layer is included within the top DBR and is typically positioned in the lower layers closer to the active region. Referred to as an oxide aperture layer, this layer is typically one of the original DBR layers that is modified to include a higher concentration of aluminum. A set of process steps is used to oxidize the majority of this layer, leaving a central portion in its original composition to form an "aperture" for confining the beam emitted from the active region.

The optical output power that may be delivered by an individual VCSEL device has been found to be inherently limited its relatively small-sized aperture, a requirement to prevent lateral spreading of the injected current as it traverses through the depth of the device structure. Achieving higher output power from individual VCSEL devices has been proposed by stacking multiple active regions between the reflective mirrors forming the laser cavity. These "multiple active region" devices electrically couple one active region to another via a tunnel junction that is formed between adjacent active regions. Doping levels within the tunnel junction need to be relatively high (e.g. greater than $1E19/cm^3$) in order to effectively transport the carriers between the active regions.

While an increase in output power may be obtained by the use of multiple active regions, the inherent problems with respect to current spreading and modal instability remain. Including a second oxide aperture below the lowest positioned active region has been proposed to limit current spread. This has the disadvantage of having to control and match as much as possible the two oxide aperture sizes, which depends on a variety of fabrication process variables including, but not limited to, the mesa etch profile of the VCSEL, aluminum composition and thickness of the layers designated for creation of the oxide apertures, etc. Besides the fabrication difficulties, the inclusion of a second oxide aperture results in a higher electrical resistance within the device (thus resulting in higher voltage requirements, lower wall plug efficiency, and higher self-heating; these factors all contributing to lower optical output power).

SUMMARY OF THE INVENTION

The problems remaining in these prior art approaches is addressed by the present invention, which relates to a high output power VCSEL having two or more active regions formed in a stack and separated by a tunnel junction, the stack itself compacted in terms of the number of individual layers so as to confine lateral current spread, increasing optical confinement and minimizing optical loss.

A multi-junction VCSEL is formed as a compact structure that reduces lateral current spreading by reducing the spacing between adjacent active regions in the stack of such regions used to form the multi-junction device. In particular, at least two of the active regions within the stack are located at adjacent peaks of the intensity profile of the VCSEL, with an intervening tunnel junction positioned at a trough between the two peaks. The alignment of the active regions with the peaks maximizes the generated optical power, while the alignment of the tunnel junction with the trough minimizes optical loss. The close spacing on adjacent peaks forms a compact structure (which may even include a cavity having a sub-$\lambda$ optical length) that lessens the total path traveled by carriers and therefore reduces lateral current spread.

The multi-junction compact VCSEL of the present invention includes some type of carrier confinement element, which in many cases comprises an oxide aperture layer positioned above the "top" active region in the stack. Alternatively, a conductive element processed to exhibit a somewhat circular form (similar in outline to the "aperture") may be used and may comprise the same dual-layer structure that is used to form the tunnel junction.

An exemplary embodiment of the present invention may take the form of a multi-junction vertical cavity surface emitting laser (VCSEL) comprised of the following elements: a first distributed Bragg reflector (DBR) formed on a substrate, a second DBR positioned over and separated from the first DBR, where each DBR comprises a stack of layers of alternating refractive index value (the combination of the first DBR and second DBR forming a resonant structure supporting a standing wave of lasing field intensity defined by a plurality of intensity peaks separated by a plurality of intensity troughs), a plurality of N active regions formed as a stack between the first DBR and the second DBR (each active region comprising an MQW structure), and one or more tunnel junctions, each tunnel junction comprising a highly conductive layer of a first conductivity type disposed over a highly conductive layer of a second conductivity type, with a separate tunnel junction disposed between an adjacent pair of active regions of the plurality of N active regions, each tunnel conjunction forming a path for carrier movement between the associated pair of active regions.

Other and further aspects and features of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
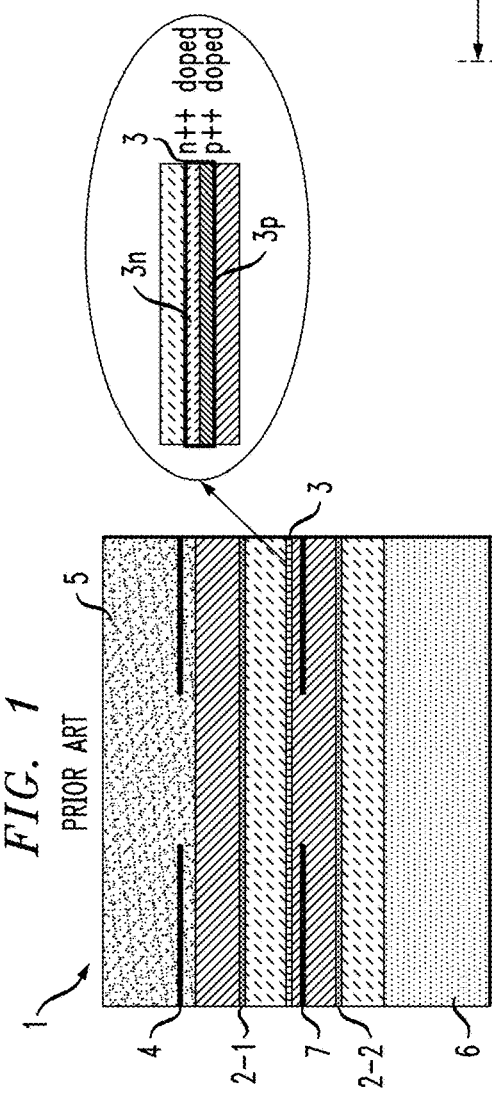
FIG. 1 is a simplified view of a prior art VCSEL.

FIG. 1 is a simplified view of a conventional prior art VCSEL 1, formed to include a pair of "stacked" active regions 2-1 and 2-2. A tunnel junction 3 is positioned between active regions 2-1 and 2-2 as shown, and is used to move holes and electrons between the active regions in a manner that energizes both regions from the bias current applied as an input to the structure (not shown). Tunnel junction 3, as shown in the enlarged portion of FIG. 1, comprises a highly-doped n-type layer 3*n* formed over a highly-doped p-type layer 3*p*. The doping levels need to on the order of $1 \times 10^{19}$ cm$^{-3}$ or greater in order to allow tunneling of carriers through the tunnel junction. A conventional oxide aperture layer 4 is shown a formed within a p-type distributed Bragg reflector (pDBR) 5, where the created optical output is typically emitted from pDBR 5. An n-type DBR, shown as nDBR 6 forms the bottom reflective portion of the laser structure.

Under reverse bias, tunnel junction 3 is used to inject electrodes into the n-side of first active region 2-1 and holes into the p-side of second active region 2-2. Theoretically, the inclusion of two active regions would then generate twice the optical output power for the same injected current (and, by extension, a stack of N active regions would generate N times the output power). While able to create some additional output power, the prior art structure as described thus far exhibits a problem with the lateral spread of the injected current as it passes from first active region 2-1 to second active region 2-2. As a result, second active region 2-2 will exhibit a lower current density (and thus lower gain) than first active region 2-1. Depending on the particular configuration, an increase in threshold current may therefore be observed.

A prior art approach of addressing this problem is to incorporate a second oxide aperture layer into the structure, shown as oxide aperture layer 7 in FIG. 1. The inclusion of this additional aperture will assist in controlling the lateral spread of the injection current and thus improve the optical performance of the device. Various fabrication issues remain with this approach and the further-extended length of the cavity results in a much higher impedance value for this device.

Figure 2:
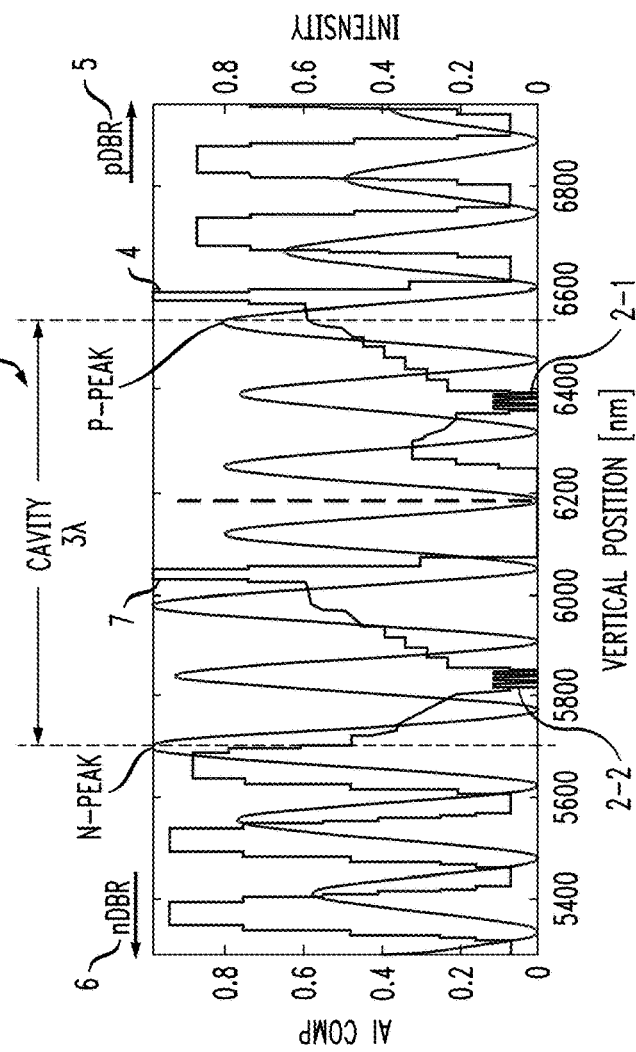
FIG. 2 depicts the aluminum composition for the various regions forming a conventional prior art VCSEL, as well as the standing wave pattern of the created field intensity.

FIG. 2 depicts the aluminum composition for the various regions of prior art VCSEL 1, as well as the standing wave pattern of the created field intensity, where these parameters are considered helpful in understanding the configuration of the VCSEL and boundaries of the cavity formed by a specific arrangement. The aluminum content within the layers within nDBR 6 is shown in the left-hand portion of the plot, with the right-hand portion showing the aluminum content within the layers of pDBR 5. Active regions 2-1 and 2-2 are indicated by the MQW structures in the central area between the two DBRs, with tunnel junction 3 positioned as shown between the n-side of first active region 2-1 and the p-side of second active region 2-2. Oxide aperture layer 5 is shown as the relatively high aluminum content layer within pDBR 5 and is shaded for identification purposes. Second oxide aperture layer 7 is similarly shown in relation to second active region 2-2.

Overlaid on this plot is the field intensity created by injecting current into the structure, which takes the form of a standing wave pattern, forming a resonant structure between the mirrors created by nDBR 6 and pDBR 5. In most cases, active regions 2-1 and 2-2 are positioned to coincide with a peak in the field intensity (to maximize the created gain), while tunnel junction 3 and oxide aperture layers 5,7 are positioned to coincide with a trough in the field intensity (to minimize loss). The cavity 8 of the structure is defined as region spanning between a first intensity peak below second active region 2-2 (denoted as N-peak in FIG. 2) and a first intensity peak above first active region 2-1 (denoted as P-peak). For this particular structure, cavity 8 is shown as have an optical length of 3λ, which is fairly extensive and is a factor in the relatively high impedance within the structure, as well as higher optical loss associated with the longer optical path.

Figure 3:
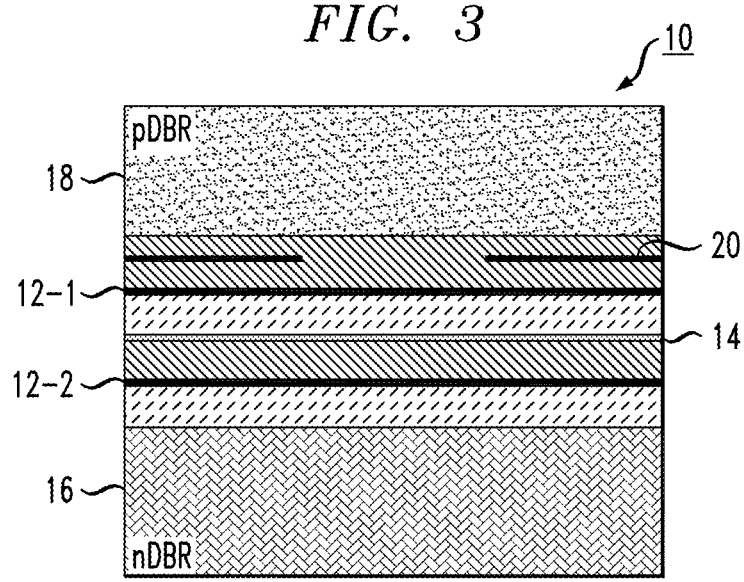
FIG. 3 illustrates an exemplary double junction VCSEL formed in accordance with the principles of the present invention.
Figure 4:
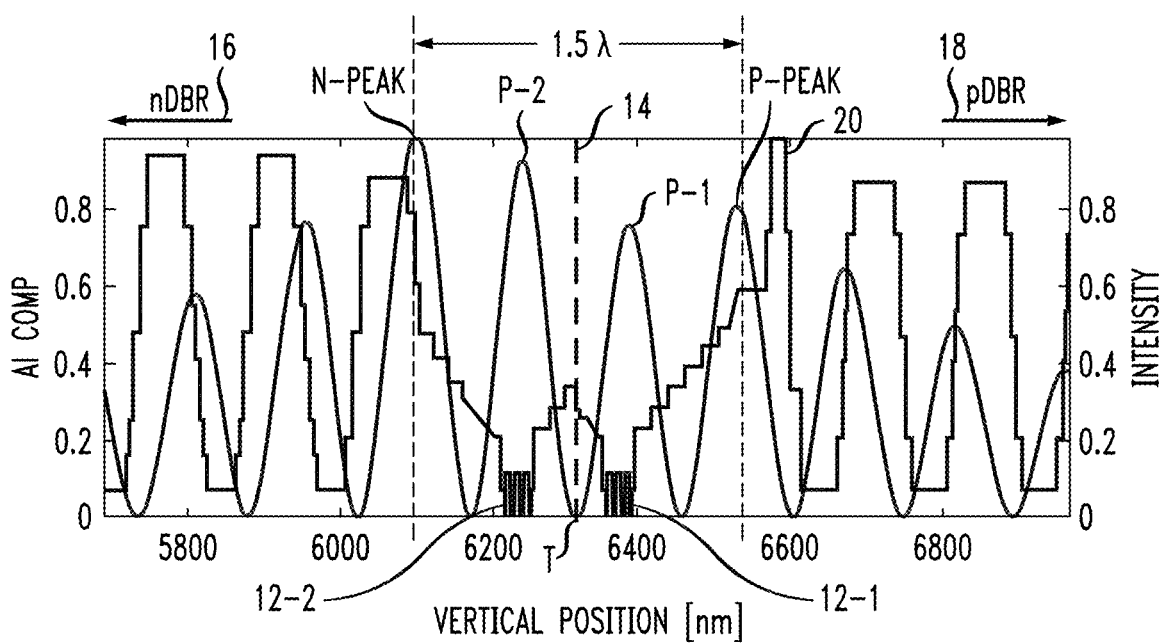
FIG. 4 is a plot of aluminum composition, overlaid with a field intensity standing wave pattern, for the arrangement of FIG. 3.

FIG. 3 illustrates an exemplary double junction VCSEL 10 formed in accordance with the present invention to exhibit a relatively compact structure, which eliminates the need for a second oxide aperture and also reduces the cavity length of the device. As shown, VCSEL 10 comprises a first active region 12-1 and a second active region 12-2, separated by a tunnel junction 14. Additionally, VCSEL 10 includes an nDBR 16 and a pDBR 18, with an oxide aperture layer 20 formed within pDBR 18. FIG. 4 is a plot of aluminum composition (and the created field intensity) for VCSEL 10, similar to FIG. 2 as described above.

In accordance with the principles of the present invention, the combination of active regions 12 and tunnel junction 14 are arranged in a compact form that minimizes the lateral spread of the injected current as it passes through the structure. In particular, active regions 12-1 and 12-2 are disposed to align with adjacent peaks in the intensity profile (shown as P-1 and P-2 in FIG. 4), with tunnel junction 14 positioned to align with the trough T between the adjacent peaks. The compactness of this arrangement when compared to prior art FIG. 2 is obvious. Also shown in FIG. 4 are the locations of the cavity boundaries (i.e., N-peak, P-peak) for the inventive structure of VCSEL 10. In association with this compact arrangement, the optical cavity length is shown as reduced from the value of $3\lambda$, (for the prior art, as discussed above), to $1.5\lambda$.

In order to further minimize the lateral current spread within compact VCSEL 10 of the present invention, the separation between oxide aperture layer 20 and first action region 12-1 may be reduced. Various details regarding the relative positioning of the active region of a VCSEL and the oxide aperture layer may be found in our co-pending U.S. patent application Ser. No. 16/858,909, filed Apr. 27, 2020 and herein incorporated by reference.

Figure 5:
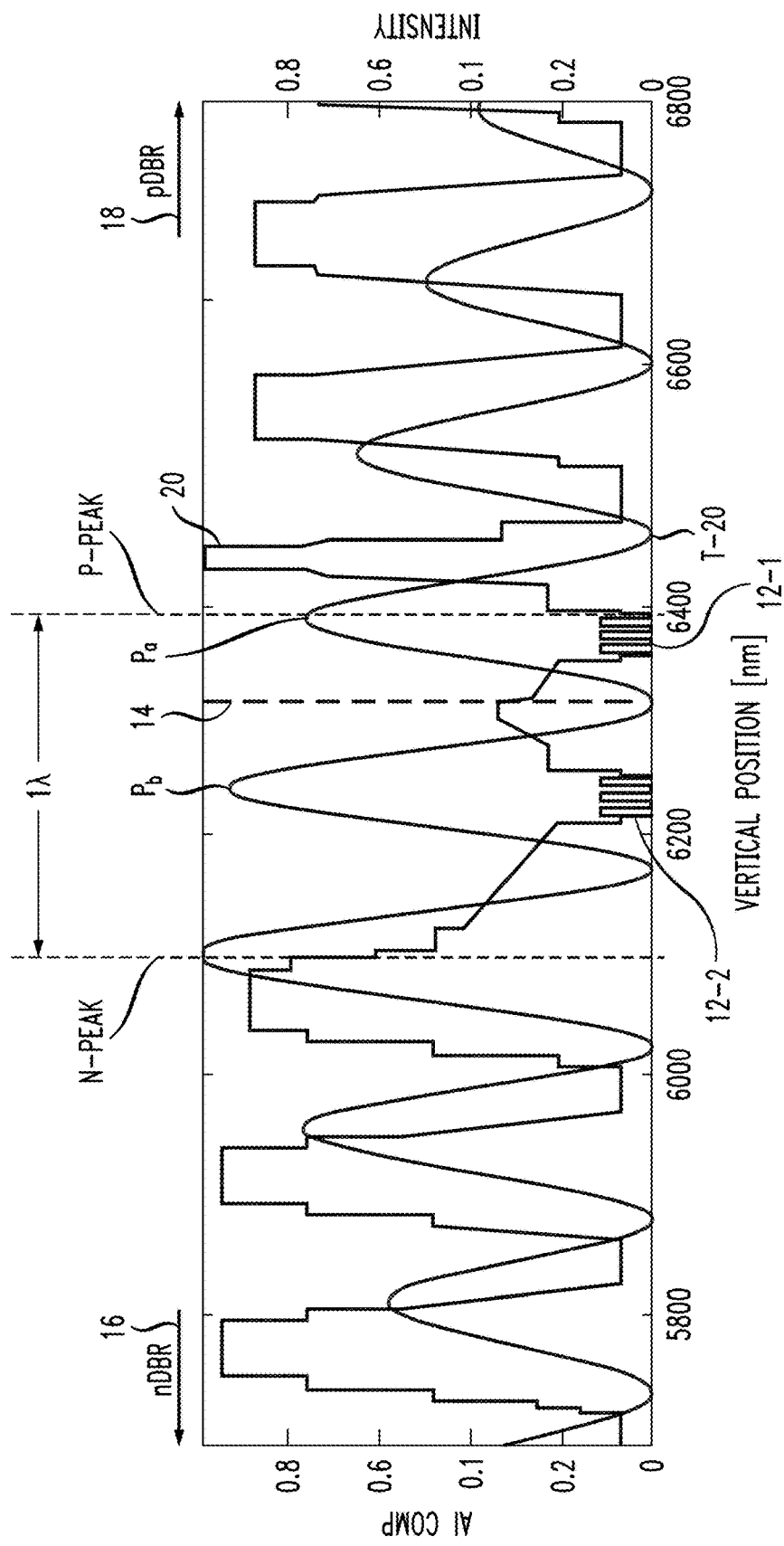
FIG. 5 is a plot of aluminum composition (and field intensity) for an embodiment of the present invention where the separation between the oxide aperture layer and the active region of the device is reduced.

FIG. 5 is plot associated with this reduced oxide aperture layer separation embodiment of the present invention. As shown, active region 12-1 is positioned on an intensity peak $P_a$ adjacent to a trough T-20 where oxide aperture layer 20 is positioned. As with the compact configuration discussed above in association with FIGS. 3 and 4, the second active region 12-2 is located at the immediately following peak (shown as intensity peak $P_b$ in FIG. 5), with tunnel junction 14 positioned at trough T between peaks $P_a$ and $P_b$. As a result of this configuration, a conventional cavity length of $1\lambda$, associated with "single" active region VCSELs is achieved. By minimizing the separation between first active region 12-1 and oxide aperture layer 20 in this manner, the lateral current spread is reduced even further, allowing for the threshold level of the injection current to be reduced (thus increasing the efficiency of VCSEL 10). Moreover, the reduced optical path minimizes the optical loss, resulting in further reduction of the threshold current as well as increase in slope efficiency, also beneficial for generating higher optical output power.

Figure 6:
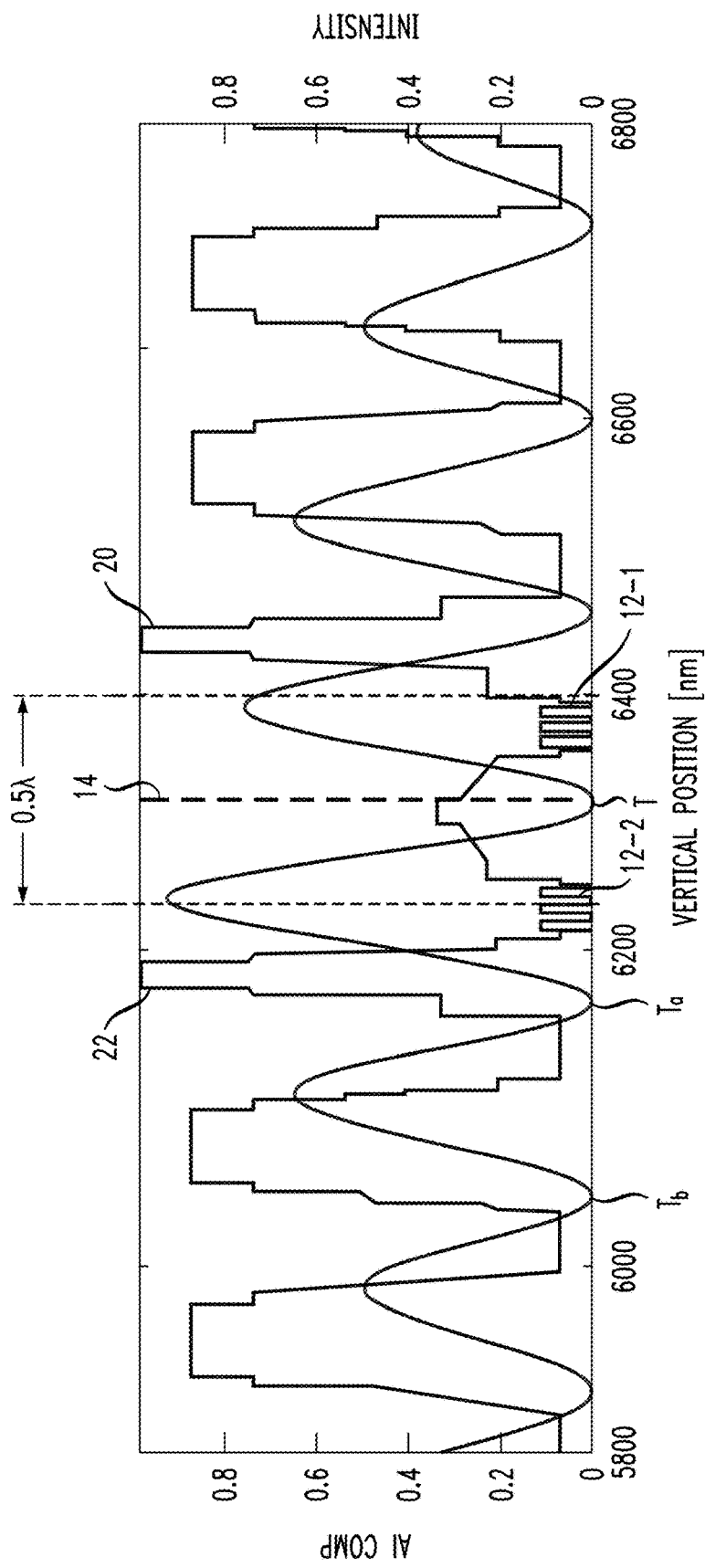
FIG. 6 is a plot, similar to that of FIG. 5, but in this case associated with a configuration of the present invention that utilizes a pair of oxide aperture layers, yet maintains a compact physical form.

If desired, it is possible to add a second oxide aperture layer to any of these arrangements. While adding some fabrication complexity and increased resistance within the structure, there may be situations where additional confinement of the injected current would be helpful. FIG. 6 is a plot showing the addition of a second oxide aperture layer 22, positioned below second active region 12-2. The inclusion of this layer modifies the intensity profile so that the optical length of the cavity is reduced to $0.5\lambda$. It is to be noted that while second oxide aperture layer 22 is positioned at trough Ta immediately below the peak associated with active region 12-2, it is also possible to locate second oxide aperture layer 22 at trough Tb, which may lessen fabrication concerns and still provide additional current confinement.

Figure 7:
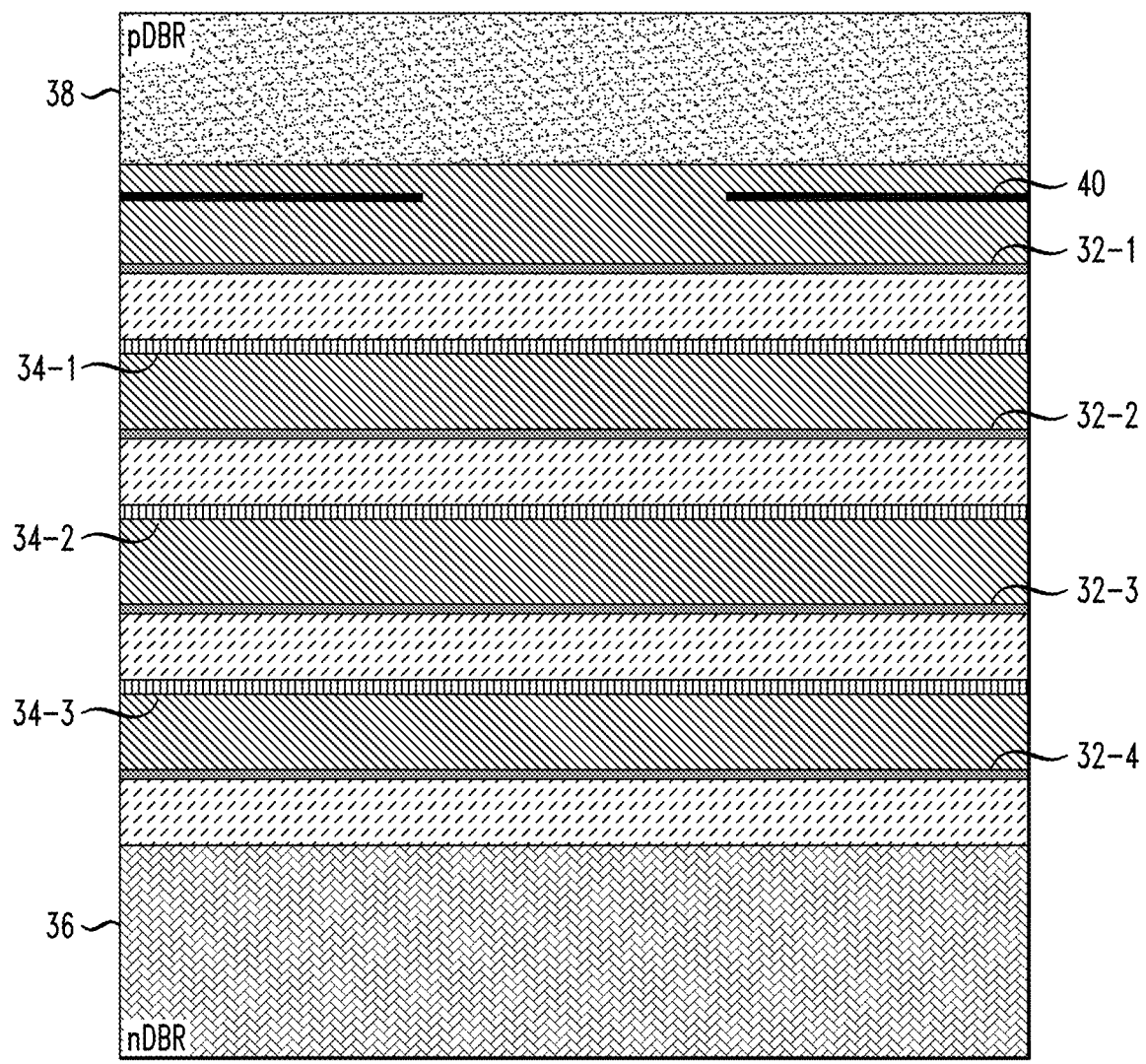
FIG. 7 illustrates an alternative embodiment of the present invention, in this case utilizing a stack of four individual active regions (separated by tunnel junctions) to form a high power VCSEL that maintains a relatively small physical size.

As mentioned above, it is possible to stack a plurality of N active regions within a VCSEL, providing a near-N increase in optical output power for substantially the same threshold level of input current. FIG. 7 illustrates an exemplary 4-stack VCSEL 30, including a series of four separate active regions 32-1, 32-2, 32-3, and 32-4, with a separate tunnel junction disposed between adjacent active regions. In particular, a first tunnel junction 34-1 is disposed between active regions 32-1 and 32-2, a second tunnel junction 34-2 is disposed between active regions 32-2 and 32-3, and a third tunnel junction is disposed between active regions 32-3 and 32-4. Compact, 4-stack VCSEL 30 also includes an nDBR 36 and pDBR 38, as shown, with an oxide aperture layer 40 disposed above first active region 32-1 in pDBR 38.

Figure 8:
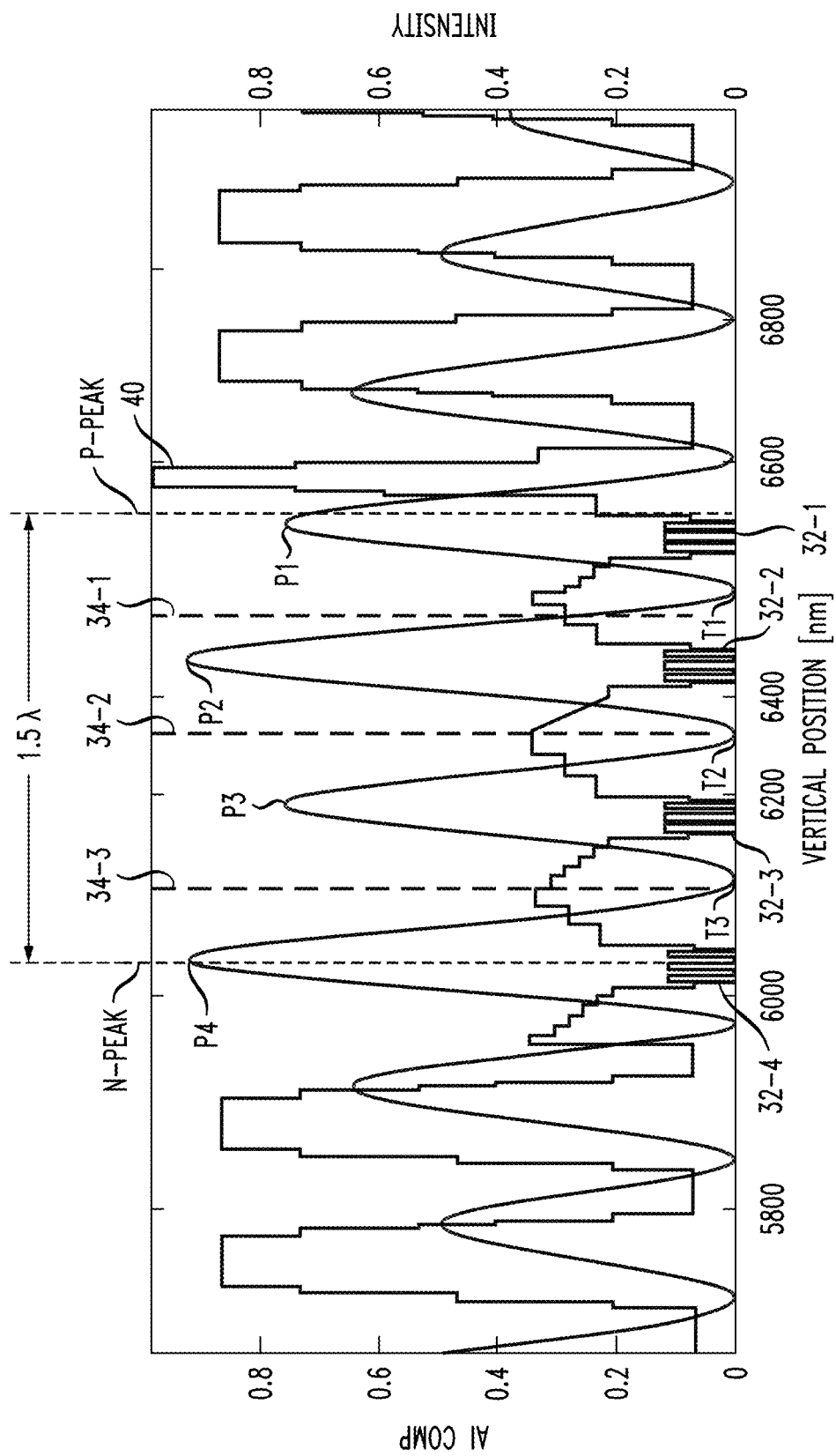
FIG. 8 is a plot of aluminum composition and intensity field for the 4-stack embodiment of FIG. 7.

FIG. 8 is a plot associated with compact, 4-stack VCSEL 30. As with the arrangements described above, it is shown that active regions 32 are positioned on adjacent peaks P1, P2, P3, and P4, with tunnel junctions 34-2, 34-2 and 34-3 positioned along the troughs T1, T2, T3 between adjacent peaks. Additionally, active region 32-1 is shown as positioned at the peak immediately below the location of oxide aperture layer 40, providing additional current confinement. As such, this inventive arrangement provides for the most compact arrangement of a set of four individual active regions, all within an optical cavity length of $1.5\lambda$.

Figure 9:
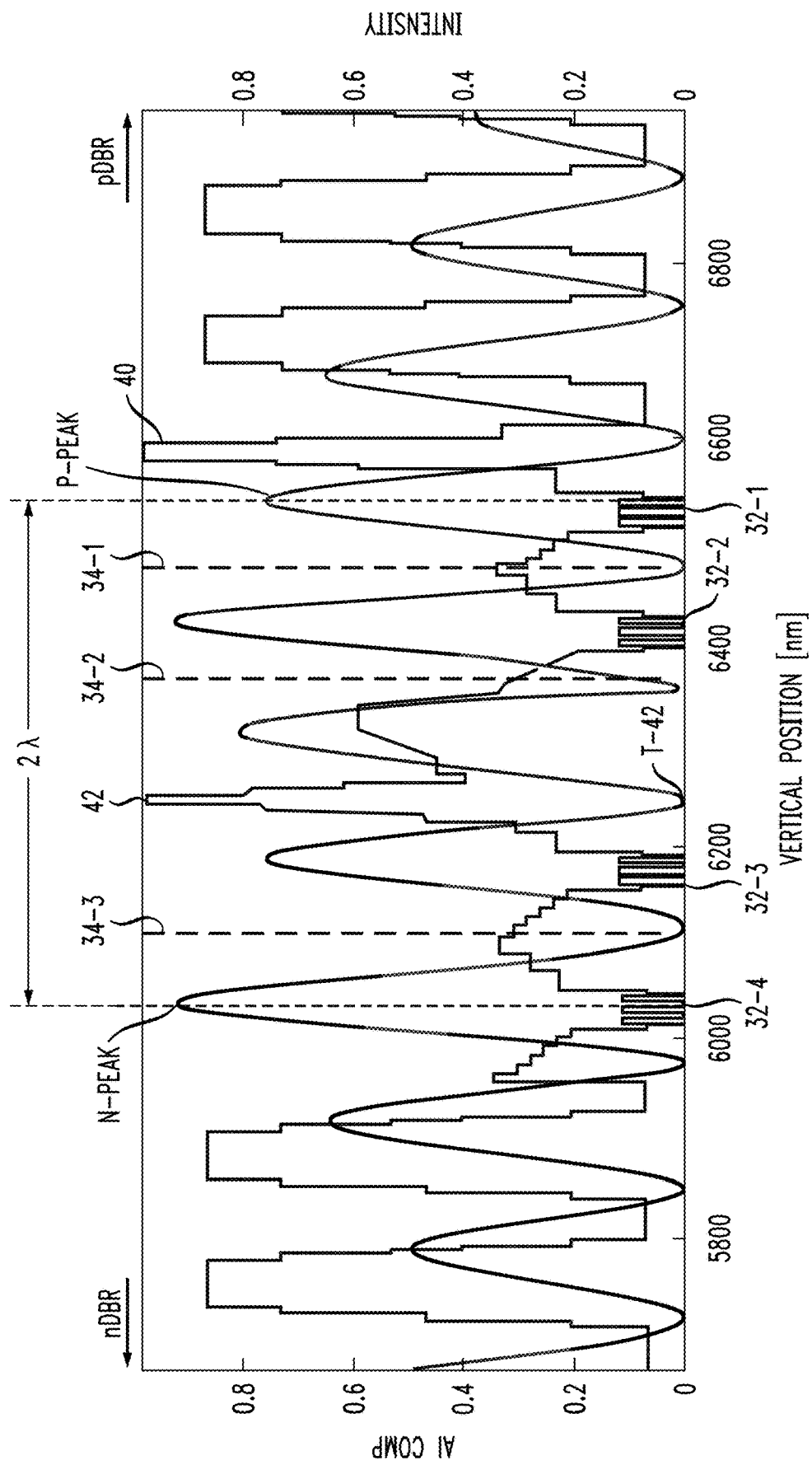
FIG. 9 is a plot associated with a variation of the arrangement of FIG. 7, in this case where a second oxide aperture is included within the 4-stack (for example, between the middle pair of active regions) to re-shape the current flow and reduce the amount of lateral current spread.

While the configuration of FIGS. 7 and 8 is extremely compact in form, there is an inherent amount of lateral current spread over the extent of all four active regions. In order to reduce the current spread, another configuration of the compact, 4-stack VCSEL 30 may be arranged to include an additional oxide aperture layer 42 within the stack (for example, in the mid-point of the set). FIG. 9 is a plot associated with this configuration. Here, second oxide aperture layer 42 is positioned at a trough T-42 immediately below the trough where tunnel junction 34-2 is located. As mentioned above, these layers may be located at various positions with respect to the field intensity plot, but positioning the oxide aperture layers at/near a trough location minimizes optical loss within the device. In this case, therefore, the choice to position second oxide aperture layer 42 at a trough results in an increased separation between active regions 32-3 and 32-3, since there is an "empty" peak in the profile between tunnel junction 34-2 and second oxide aperture 42. This double oxide aperture embodiment of the present invention is shown in FIG. 9 as having a cavity with an optical length of $2\lambda$, (including a stack of four separate active regions), still well below the $3\lambda$, cavity size of the prior art double active region arrangement.

While the various embodiments of a compact, multi-junction VCSEL of the present invention have been described as using an oxide aperture layer for carrier confinement, it is to be understood that there are other techniques that may be used to provide carrier confinement. For example, instead of using a dielectric layer with a central aperture, a central "highly conductive" element may be used to achieve the same result. Thus, in accordance with the teachings of the present invention, a centrally-located tunnel junction structure may be added to the "stack" about the first active region (inasmuch as a fabrication process including steps of forming interposed tunnel junctions has been developed), and use this top tunnel junction as a carrier confinement element.

Figure 10:
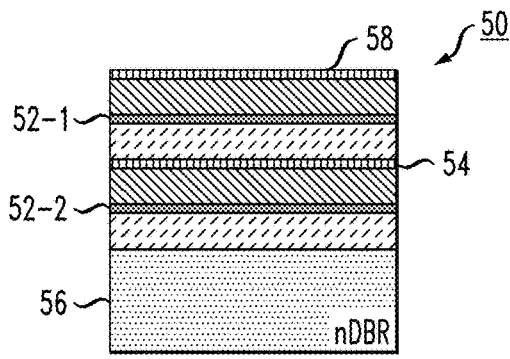
FIG. 10 is a simplified diagram of an exemplary step in the fabrication process of forming a compact VCSEL of the present invention that utilizes a high conductivity central region (instead of an "aperture") to provide current confinement.
Figure 11:
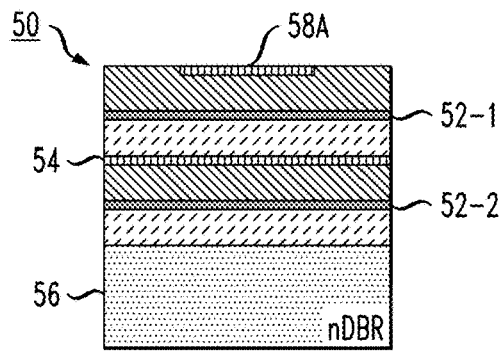
FIG. 11 illustrates a following step in the process as outlined in FIG. 10, where the high conductivity material is patterned to create the central region into a circular form.
Figure 12:
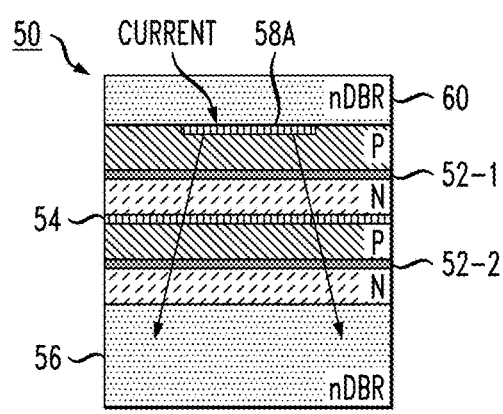
FIG. 12 illustrates a following step in the process where a "top" DBR is formed over the structure of FIG. 11.

FIGS. 10-12 illustrate a set of process steps that may be used to form a centrally-located tunnel junction within a compact, multi-junction VCSEL of the present invention.

FIG. 10 illustrates a point in the process of an exemplary compact, double-junction VCSEL 50 where all of the device layers except for the upper-most DBR mirror have been formed. VCSEL 50 at this point is shown as including a first active region 52-1 and a second active region 52-2, separated by a tunnel junction 54. The various semiconductor layers required to form this structure have been fabricated upon an nDBR 56, as shown.

Prior to the formation of a pDBR, a tunnel junction 58 is shown as formed over the exposed p-side surface of first active region 52-1. In order to provide "confinement", the structure of tunnel junction 58 needs to be modified so that only a central conductive "disk" remains. To achieve this, the structure shown in FIG. 10 is patterned and etched in a manner well-known in the art to remove an outer portion of tunnel junction 58, leaving only conductive disk 58A, as shown in FIG. 11. Once conductive disk 58A is formed, a second DBR 60 is added over the exposed surface. In this case, another n-type DBR is used, as shown in the final device structure of FIG. 12.

Lateral confinement is achieved by having conductive disk 58A, with nDBR 60 covering its exposed surface. While the conductivity in the central region is increased by the presence of disk 58A, the PN junction formed between the p-side of active region 52-1 and top nDBR 60 would be non-conductive (i.e., reverse-biased). While this approach has the complexity of requiring overgrowth of nDBR 60, the ability to use an n-type DBR results in a lower optical loss when compared to the conventional pDBR (i.e., lower threshold and high slope), as well as lower resistance (since conductivity of n-doped semiconductor materials is greater than that of p-doped semiconductor materials).

Figure 13:
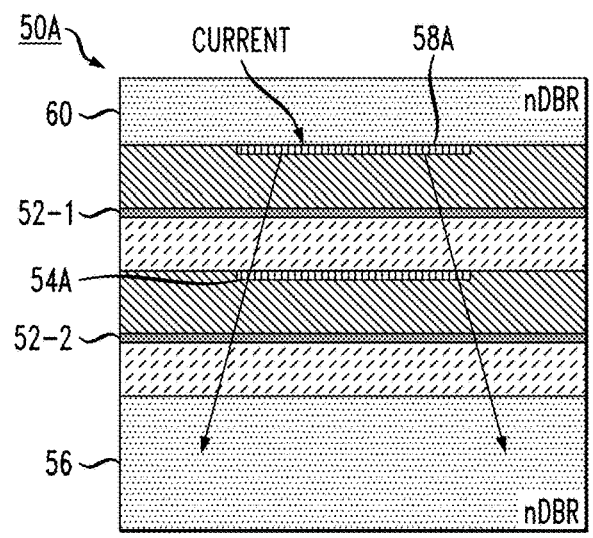
FIG. 13 illustrates an alternative configuration to the embodiment of FIG. 12, where in this case a second high conductivity central region is formed within a stack of active regions to improve the current confinement capability of a high power, compact multi-junction VCSEL formed in accordance with the principles of the present invention.

FIG. 13 illustrates an alternative embodiment of the configuration of FIG. 12. In this case, additional carrier confinement is achieved by also etching tunnel junction 54 to remove the outer peripheral region, leaving conductive disk 54A. Again, while this improves carrier confinement within the structure, it adds yet more complexity to the fabrication process.

While the foregoing is directed to embodiments of the present invention, other and further embodiments of the invention may be devised without departing from the basic scope thereof, which is determined by the claims that follow.

What is claimed is:

1. A multi-junction vertical cavity surface emitting laser (VCSEL) comprising:
   a first distributed Bragg reflector (DBR) formed on a substrate;
   a second DBR positioned over the first DBR, where each DBR comprising a stack of layers of alternating refractive index value, the combination of the first DBR and second DBR forming a resonant structure supporting a standing wave of lasing field intensity defined by a plurality of intensity peaks separated by a plurality of intensity troughs;
   a plurality of N active regions formed as a stack of active regions between the first DBR and the second DBR, each active region comprising an MQW structure; one or more tunnel junctions, each tunnel junction comprising a highly conductive layer of a first conductivity type disposed over a highly conductive layer of a second conductivity type, with a separate tunnel junction disposed between an adjacent pair of active regions of the plurality of N active regions, each tunnel junction forming a path for carrier movement between the associated pair of active regions; and
   a carrier confinement element comprises a conductive element having a tunnel junction patterned to exhibit a patterned disk structure.

2. The multi-junction VCSEL as defined in claim 1 wherein one or more active regions of the plurality of N active regions are positioned to overlap individual intensity peaks of the plurality of intensity peaks.

3. The multi-junction VCSEL as defined in claim 1 wherein each active region of the plurality of N active regions is positioned to overlap a separate intensity peak of the plurality of intensity peaks.

4. The multi-junction VCSEL as defined in claim 1 wherein one or more tunnel junctions are positioned to overlap individual intensity troughs of the plurality of intensity troughs.

5. The multi-junction VCSEL as defined in claim 1 wherein each tunnel junction is positioned to overlap a separate intensity trough of the plurality of intensity troughs.

6. The multi-junction VCSEL as defined in claim 1 wherein the multi-junction VCSEL further comprises
   the carrier confinement element disposed above and in proximity to a top active region in the stack of active regions.

7. The multi-junction VCSSEL as defined in claim 6 wherein the carrier confinement element comprises a conductive element disposed in a central region of the VCSEL structure.

8. The multi-junction VCSEL as defined in claim 6 wherein the multi-junction VCSEL further comprises one or more additional carrier confinement elements disposed in the cavity between the first DBR and the second DBR.

9. The multi-junction VCSEL as defined in claim 8 wherein an additional carrier confinement element is positioned at a mid-point of the stack of active regions.

10. The multi-junction VCSEL as defined in claim 9 wherein the additional carrier confinement element is positioned to overlap an intensity trough.

* * * * *